US010875351B2

(12) United States Patent
Libsch et al.

(10) Patent No.: US 10,875,351 B2
(45) Date of Patent: *Dec. 29, 2020

(54) ELECTRICAL COMPONENT ASSEMBLY ON FLEXIBLE MATERIALS

(71) Applicant: International Business Machines Corporation, Armonk, NY (US)

(72) Inventors: Frank R. Libsch, White Plains, NY (US); Ghavam G. Shahidi, Pound Ridge, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/444,057

(22) Filed: Jun. 18, 2019

(65) Prior Publication Data

US 2019/0299702 A1 Oct. 3, 2019

Related U.S. Application Data

(63) Continuation of application No. 15/713,749, filed on Sep. 25, 2017, now Pat. No. 10,391,805.

(51) Int. Cl.
*B32B 3/00* (2006.01)
*B42D 25/373* (2014.01)
(Continued)

(52) U.S. Cl.
CPC ........... *B42D 25/373* (2014.10); *B41M 3/006* (2013.01); *B41M 3/14* (2013.01); *B42D 25/355* (2014.10); *G06K 19/08* (2013.01); *H04B 5/00* (2013.01)

(58) Field of Classification Search
CPC .... B42D 25/355; B42D 25/373; B41M 3/006; B41M 3/14; G06K 19/08; H04B 5/00
See application file for complete search history.

(56) References Cited

U.S. PATENT DOCUMENTS

| 5,521,425 A | 5/1996 | Deeney |
| 2003/0164611 A1 | 9/2003 | Schneider et al. |

(Continued)

FOREIGN PATENT DOCUMENTS

| EP | 1501054 A3 | 6/2007 |
| WO | 0103945 A1 | 1/2001 |
| WO | 2006117804 A3 | 11/2006 |

OTHER PUBLICATIONS

Suwald, "Thin Chips for Document Security," Ultra-thin Chip Technology and Applications, Chapter 31, 2011, pp. 399-411, DOI: 10.1007/978-1-4419-7276_31, Copyright Springer Science+Business Media, LLC.

(Continued)

*Primary Examiner* — Elizabeth E Mulvaney
(74) *Attorney, Agent, or Firm* — Jared C. Chaney

(57) ABSTRACT

The present invention provides a method and a structure of electrical component assembly on flexible materials. In an exemplary embodiment, the method and the structure include patterning metal on a tape, creating one or more holes in the tape, attaching one or more electronic devices to the tape in the one or more holes such that a profile of the tape and the one or more electronic devices is less than a threshold, electrically connecting the one or more electronic devices to the patterned metal, cutting the tape, resulting in one or more component portions of the tape and one or more excess portions of the tape, where the one or more component portions comprises at least one of the one or more electronic devices, attached to the patterned metal, and bonding the one or more component portions to a ribbon.

20 Claims, 16 Drawing Sheets

(51) Int. Cl.
*B41M 3/14* (2006.01)
*B41M 3/00* (2006.01)
*G06K 19/08* (2006.01)
*B42D 25/355* (2014.01)
*H04B 5/00* (2006.01)

(56) References Cited

U.S. PATENT DOCUMENTS

| | | |
|---|---|---|
| 2008/0259416 A1 | 10/2008 | Peters et al. |
| 2009/0014999 A1 | 1/2009 | Patel et al. |
| 2010/0090016 A1 | 4/2010 | Koyama et al. |
| 2016/0353619 A1 | 12/2016 | Kato et al. |
| 2019/0092083 A1 | 3/2019 | Libsch et al. |

OTHER PUBLICATIONS

Libsch et al., "Electrical Component Assembly on Flexible Materials," U.S. Appl. No. 15/713,749, filed Sep. 25, 2017.
List of IBM Patents or Patent Applications Treated as Related, Dated Jun. 17, 2019, 2 pages.

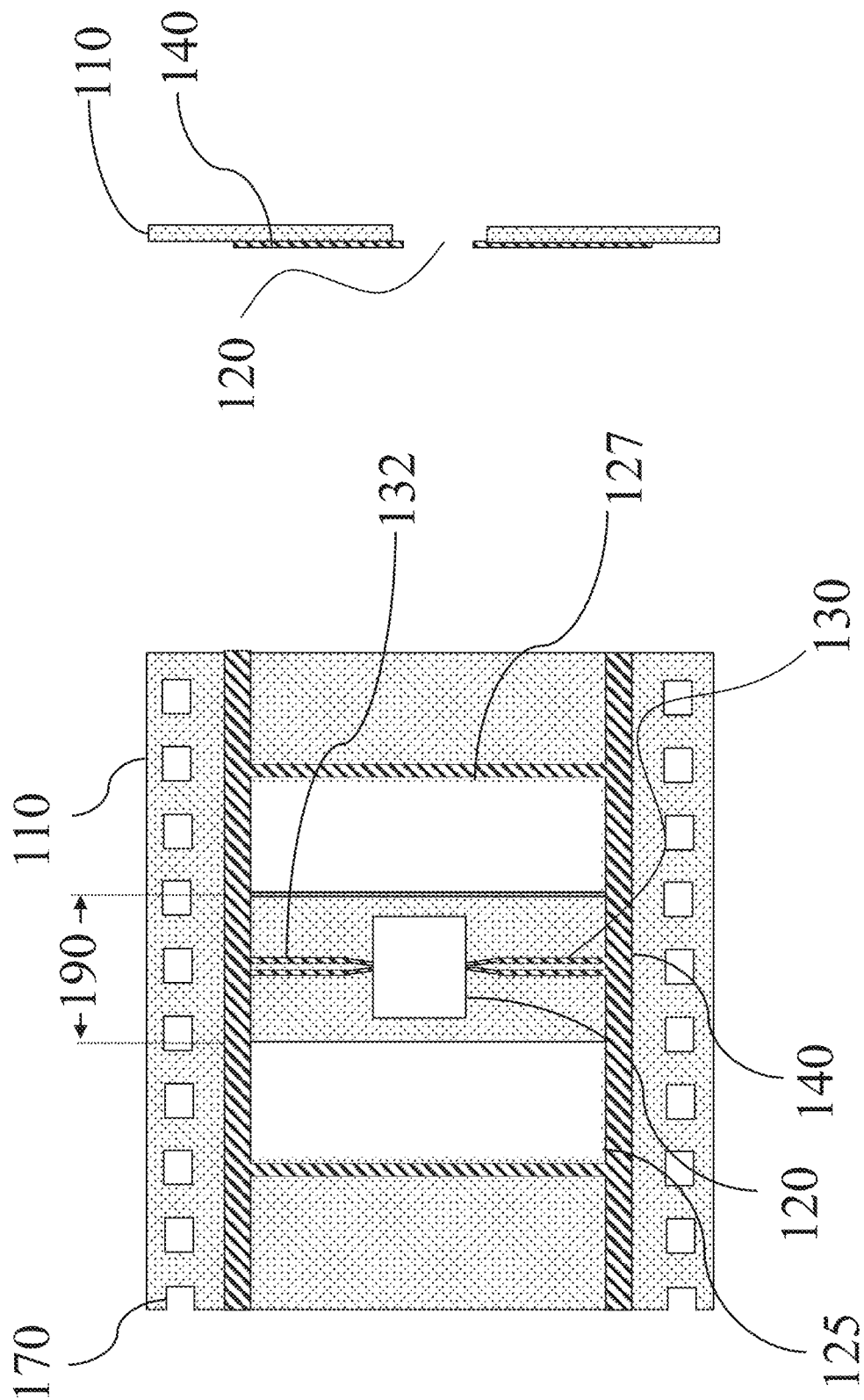

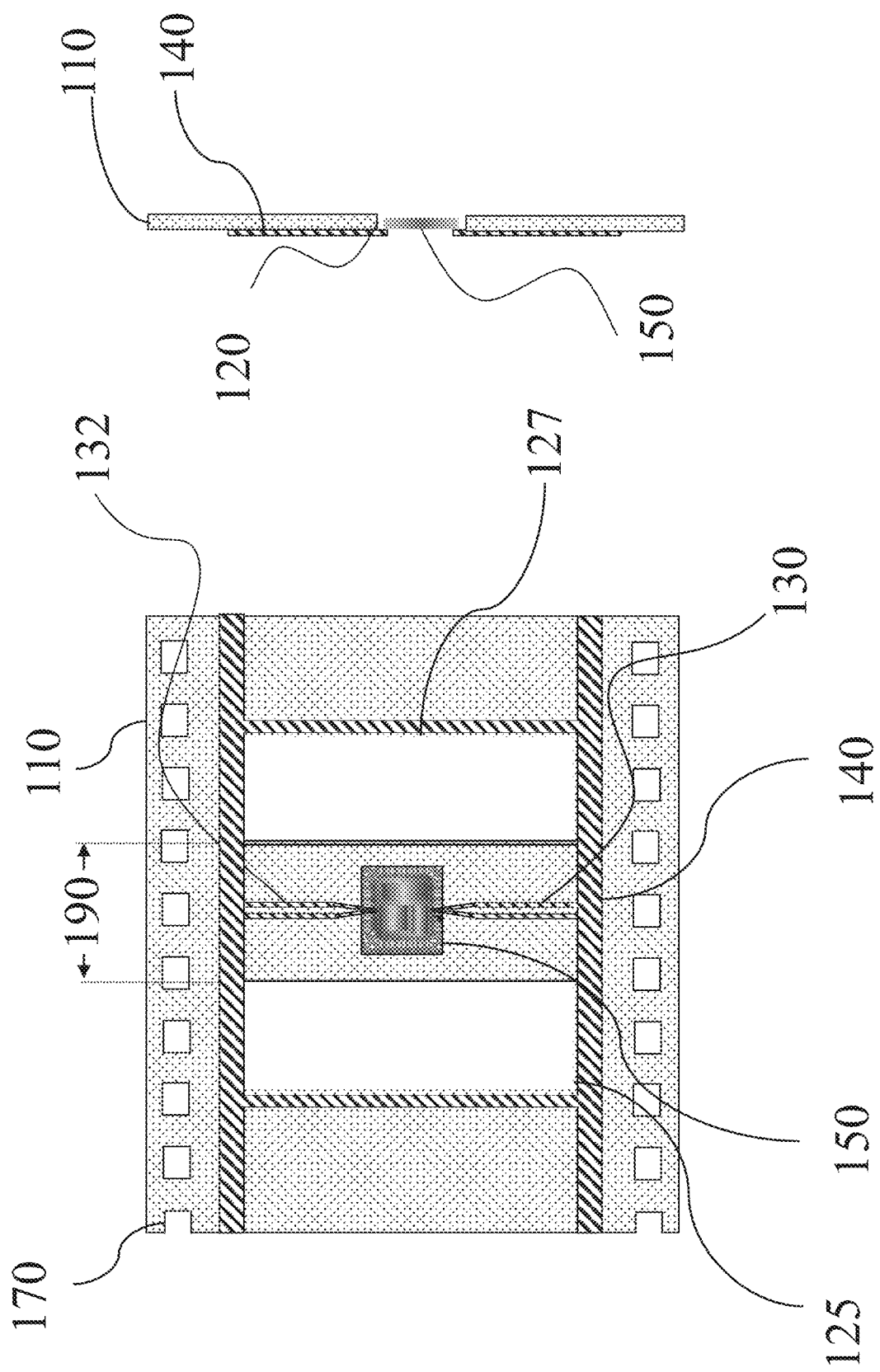

ELECTRICAL COMPONENT ASSEMBLY ON FLEXIBLE MATERIALS

BACKGROUND

The present disclosure relates to the packaging of several electrical components, and more specifically, to electrical component assembly on flexible materials.

SUMMARY

The present invention provides a method and a structure of electrical component assembly on flexible materials. In an exemplary embodiment, the method includes patterning metal on a tape, creating one or more holes in the tape, attaching one or more electronic devices to the tape in the one or more holes such that a profile of the tape and the one or more electronic devices is less than a threshold, electrically connecting the one or more electronic devices to the patterned metal, cutting the tape, resulting in one or more component portions of the tape and one or more excess portions of the tape, where the one or more component portions comprises at least one of the one or more electronic devices, attached to the patterned metal, and bonding the one or more component portions to a ribbon.

In an embodiment, the structure includes a tape, a patterned metal on the tape, one or more holes in the tape, one or more electronic devices attached to the tape in the one or more holes such that a profile of the tape and the one or more electronic devices is less than a threshold, and one or more electrical connections formed between the patterned metal and the one or more electronic devices.

In an embodiment, the method includes patterning metal on a tape, creating one or more holes in the tape, attaching one or more electronic devices to the tape in the one or more holes such that a profile of the tape and the one or more electronic devices is less than a threshold, electrically connecting the one or more electronic devices to the patterned metal, and cutting the tape, resulting in one or more component portions of the tape and one or more excess portions of the tape, where the one or more component portions comprises at least one of the one or more electronic devices attached to the patterned metal, where the patterned metal forms one or more antennas, where the cutting determines a length of the one or more antennas.

BRIEF DESCRIPTION OF THE DRAWINGS

FIG. 1E depicts a diagram in accordance with an exemplary embodiment of the present invention.

FIG. 1F depicts a cross-section diagram in accordance with an exemplary embodiment of the present invention.

FIG. 1G depicts a diagram in accordance with an exemplary embodiment of the present invention.

FIG. 1H depicts a cross-section diagram in accordance with an exemplary embodiment of the present invention.

DETAILED DESCRIPTION

Figure 1B:
FIG. 1B depicts a cross-section diagram in accordance with an exemplary embodiment of the present invention.

The present invention provides a method and a structure of electrical component assembly on flexible materials. In an exemplary embodiment, the method includes patterning metal on a tape, creating one or more holes in the tape, attaching one or more electronic devices to the tape in the one or more holes such that a profile of the tape and the one or more electronic devices is less than a threshold, electrically connecting the one or more electronic devices to the patterned metal, cutting the tape, resulting in one or more component portions of the tape and one or more excess portions of the tape, where the one or more component portions comprises at least one of the one or more electronic devices, attached to the patterned metal, and bonding the one or more component portions to a ribbon.

In an embodiment, the structure includes a tape, a patterned metal on the tape, one or more holes in the tape, one or more electronic devices attached to the tape in the one or more holes such that a profile of the tape and the one or more electronic devices is less than a threshold, and one or more electrical connections formed between the patterned metal and the one or more electronic devices.

In an embodiment, the method includes patterning metal on a tape, creating one or more holes in the tape, attaching one or more electronic devices to the tape in the one or more holes such that a profile of the tape and the one or more electronic devices is less than a threshold, electrically connecting the one or more electronic devices to the patterned metal, and cutting the tape, resulting in one or more component portions of the tape and one or more excess portions of the tape, where the one or more component portions comprises at least one of the one or more electronic devices attached to the patterned metal, where the patterned metal forms one or more antennas, where the cutting determines a length of the one or more antennas.

Internet of things (IoT) devices have the promise of introducing sensing, computation, storage, and input-output (I/O) communication that can be embedded into many materials to help provide a smarter material. For example, sensors in an IoT device have the ability to sense environmental aspects around the material of interest, such as temperature, humidity, shock, vibrations, pH, and other aspects such as tracking, etc. Embedded computation logic and memory on the same IoT device can interpret the sensors' data and execute "computation at the edge". Lastly IoT device I/O communication circuitry, such as RF circuitry enabled by onboard antennas, can provide a communication channel for sending/receiving data between IoT devices and/or a more centrally monitored system such as a cloud computing system or a smart phone. To enable these functionalities, the physical form of IoT devices need to be compatible with the many materials that they are embedded in.

Of particular emerging interest are IoT devices that can be embedded into paper based materials, such as banknotes, legal documents, tickets and smart labels, clothing, fabrics or other flexible media. It may be beneficial for IoT devices to be thin, flexible, and small to enable the devices to withstand the rigors of daily use with minimal change (for example, the smallest change realistically possible) to the paper or to the IoT device.

Scaling RF antenna size down to a size suitable for embedding in thin and flexible IoT devices while maintaining transmission reliability can be challenging. It is often beneficial to reduce the size of antenna to decrease costs, improve robustness and reliability, and reduce noticeability in thin materials (i.e. paper). However, to maintain good signal-to-noise integrity at low transmission power levels, antennas maximize signal efficiency at ¼ the wavelength of transmission. Some attempts have been made to reduce the antennas sizes of the IoT devices, but these attempts came at the expense of increased power consumption to overcome reduced antennas efficiency. Many remote scaled IoT devices will rely on harvesting—limited power from incoming RF or other means, and cannot afford any inefficiencies. Other attempts have been made to decrease the wavelength of transmission by increasing the RF transmission frequency. However, higher RF transmission frequencies cause RF communications to become more confined to direct line of sight, or in general, shorter transmission distances. Scaling antenna size for each particular application can be beneficial for certain applications.

Another challenge to integrating IoT devices into paper is the package integration of an antenna that have scaling limitations with a scalable IoT device that continues to scale with technology iterations. The assembly process for these devices may require different assembly tools of different tolerances. For example, a single electronic device or chip could be used for several different applications, but with traditional processing, modifying the antenna size could require significant modifications to the assembly process.

In an embodiment of the present invention, an electronic device is attached to a film (e.g., a flexible photographic or video film) and a metal antenna is printed onto the film. The flexibility of the film can increase the robustness of the device/antenna. In an embodiment, the film is processed with a reel to reel process. In an embodiment, the reel to reel process includes transferring tape wound on a first reel to a second reel by winding the tape on the second reel and unwinding it from the first reel. In an embodiment, the method includes transferring the tape from a first reel to a second reel. In an embodiment, a reel is processed with a reel to reel process at a first station and transferred to a second station for a second reel to reel processing. In an embodiment, a reel is run through several processing stations during one reel to reel transfer. In an embodiment, an antenna could be printed in such a way that a continuous cutting of the film by an adjustable cutting implement could produce antenna of various lengths.

In an embodiment, a location of the cutting determines a length of the patterned metal on both the one or more component portions and the one or more excess portions of the tape. Further, it may be advantageous in some applications to have more than one antenna printed with each IoT device, to enable, for example, transmission at one or more frequencies (wavelengths) and/or reception at one or more frequencies (wavelengths). One such application would enable cross-talk free communication with different sources and/or different IoT devices communicating in different frequencies. The present embodiment allows multiple antennas per IoT device to also be printed in such a way that a cutting or stamping of the film produces several antennas of different lengths.

In an embodiment, a film is used to process electronic devices. For example, a 35 mm film, similar to those used for motion pictures, could be used to make an RF transmitter and antenna. Other commonly used films may include 45 mm and 70 mm, or any other width. In an embodiment, a film is a tape. In an embodiment, a tape is a film. In an embodiment, a reel is a canister in which a tape or a film is wound. In an embodiment, reel to reel processing is removing a film or tape from one reel, processing the tape, and winding the tape on another reel.

Figure 1A:
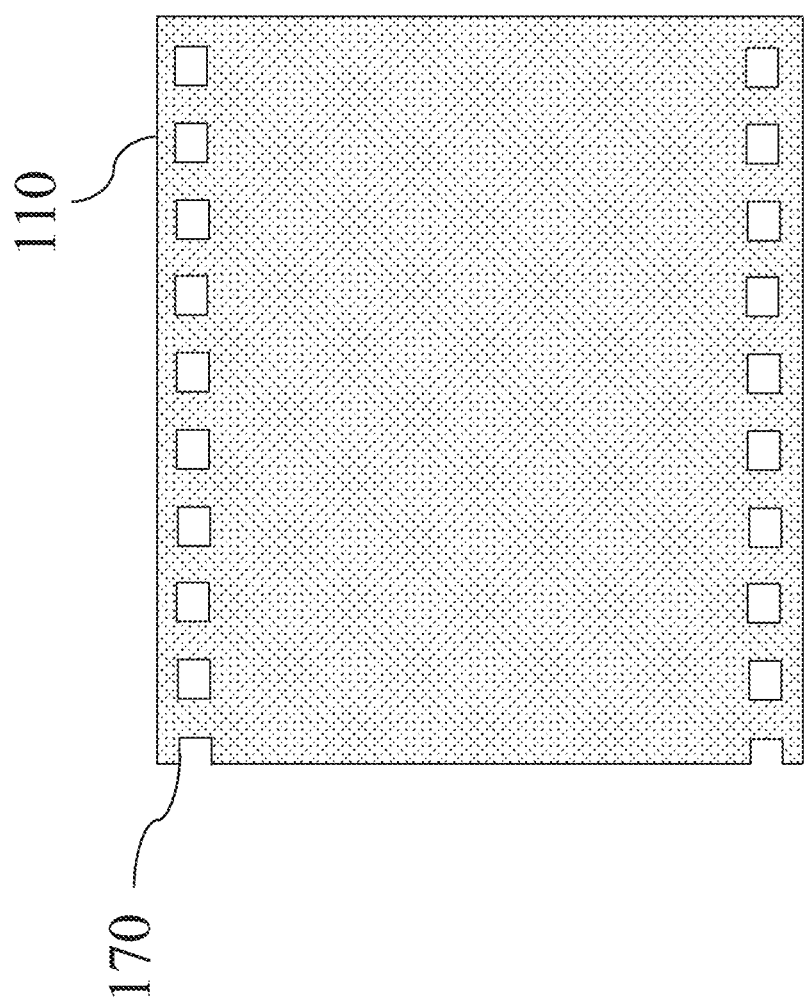
FIG. 1A depicts a diagram in accordance with an exemplary embodiment of the present invention.

Referring to FIGS. 1A and 1B, in an embodiment, a film 110 with feeder holes 170 is used. In an embodiment, film 110 is one section of a longer strip of film. In an embodiment, film 110 is wound on a reel. In an embodiment, the film is transferred from one reel to another during processing. In an embodiment, the tape has holes along at least one edge of the tape for advancing the tape. In an embodiment, feeder holes 170 are used to advance the film through various processing techniques. For example, feeder holes 170 could be used to control the flow of the film through a metal deposition process by using a wheel with teeth (i.e., sprockets) designed to fit in feeder holes 170. The sprocket could stop the film for a prescribed time during the processing of one area of the film. The wheel could then advance the film such that the next area of the film to be processed is in the correct position for processing. In an embodiment, the reel could be loaded into a chamber with a controlled atmosphere, processed, and removed from the chamber.

Figure 1D:
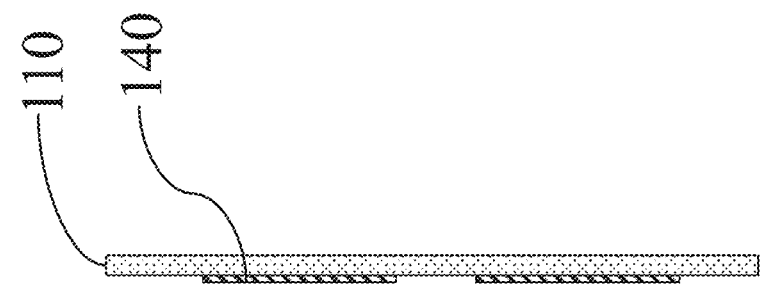
FIG. 1D depicts a cross-section diagram in accordance with an exemplary embodiment of the present invention.
Figure 1C:
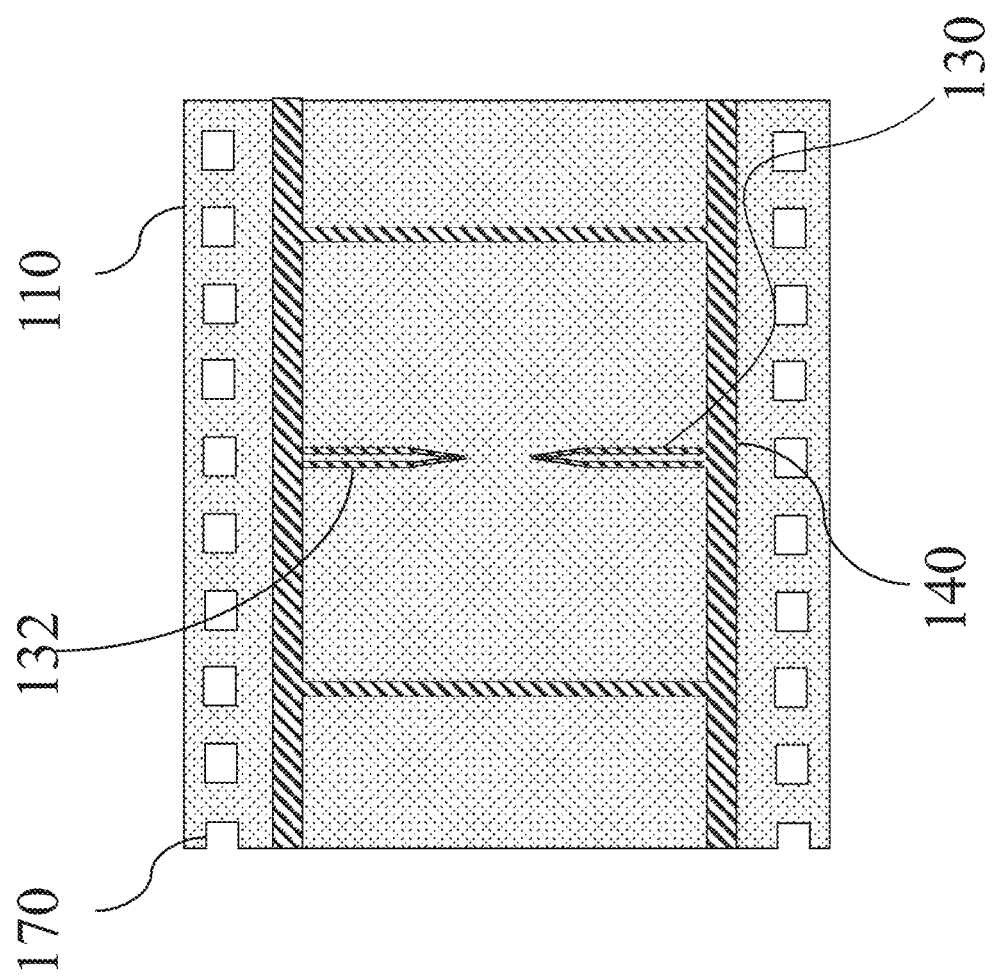
FIG. 1C depicts a diagram in accordance with an exemplary embodiment of the present invention.

Referring to FIGS. 1C and 1D, in an embodiment, a metal pattern 140 is deposited or printed on film 110. In an embodiment, the metal is deposited as a blanket over the surface of film 110 and a portion of the metal is removed to form pattern 140. For example, a photolithography/etching process could be used to form the metal pattern. In an embodiment, antennas 132 and 130 are printed or deposited as part of metal pattern 140. In an embodiment, parts of metal pattern 140 that are not part of antennas 132 and 130 are present for other functions, such as electrostatic discharge protection or testing of the device. For example, electronic probes could contact various portions of metal pattern 140 to ensure that there are no conductivity breaks in the pattern.

Referring to FIGS. 1E and 1F, in an embodiment, holes 125, 127, and 120 are created in film 110. For example, the holes could be cut, punched, or etched into film 110. In an embodiment, hole 120 is sized for the placement of an electronic component. In an embodiment, holes 125 and 127 are created to size a dimension 190.

Referring to FIGS. 1G and 1H, in an embodiment, an electronic device 150 is placed in hole 120. In an embodiment, electronic device 150 is soldered to a portion of metal pattern 140. For example, electronic device could be soldered to antennas 130 and 132. The soldering could form a mechanical bond as well as an electrical connection. In an embodiment, electronic device 150 is bonded to film 110. In an embodiment, the one or more electronic devices are bonded to the tape (film). In an embodiment, the one or more electronic devices comprises a two-chip stack. In an embodiment, the two-chip stack comprises two chips connected using flip chip bonding. For example, an epoxy could be used to bond electronic device 150 in hole 120. In another example, solder could be used to bond the electronic device 150 to antennas 130 and 132.

Figures 1I, 1J:
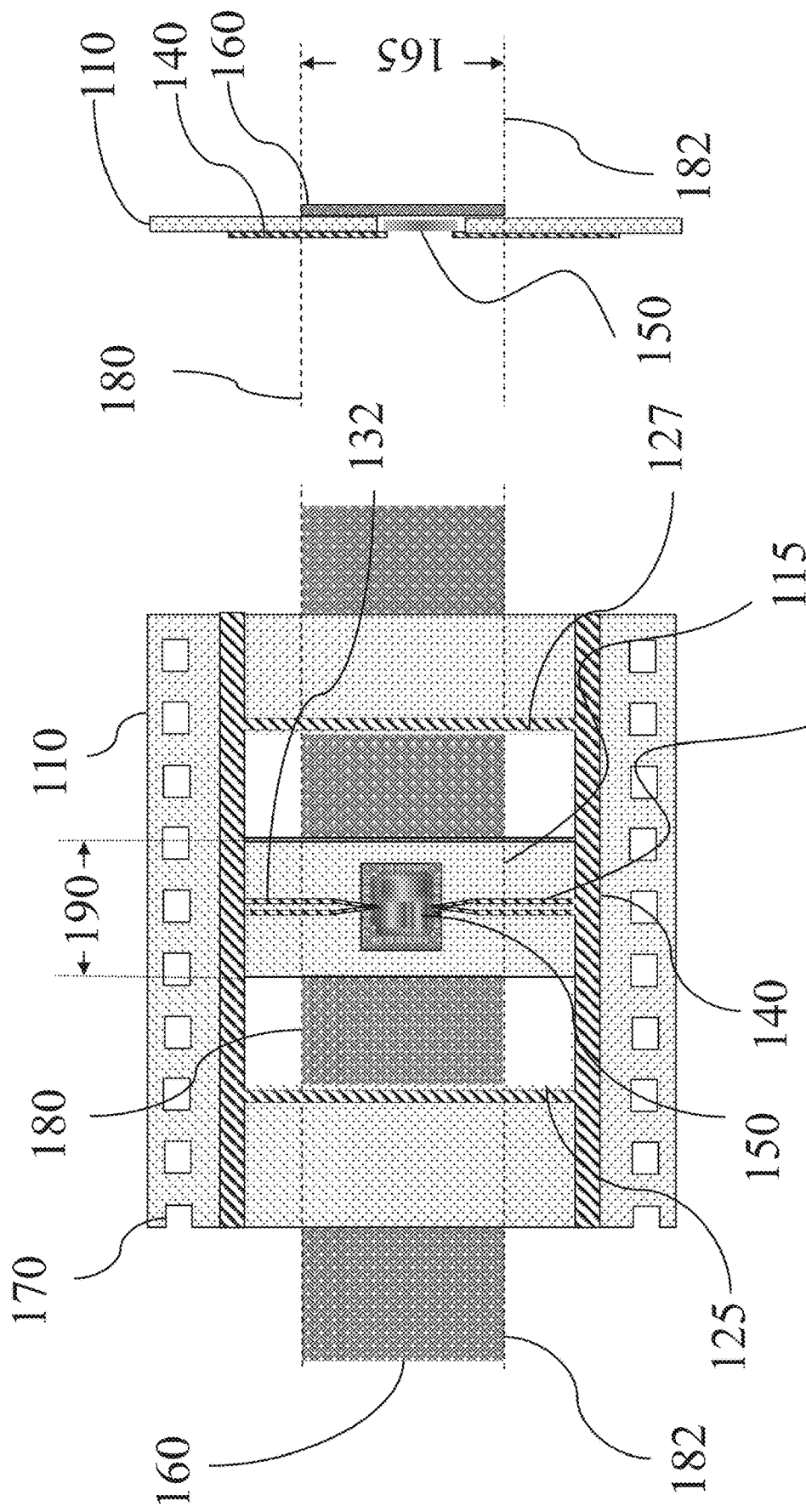
FIG. 1I depicts a diagram in accordance with an exemplary embodiment of the present invention.
FIG. 1J depicts a cross-section diagram in accordance with an exemplary embodiment of the present invention.

Referring to FIGS. 1I and 1J, in an embodiment, film 110 is cut along lines 180 and 182 such that a component portion 115 is separated from the film 110. In an embodiment, component portion 115 includes the electronic device 150 and at least part of antennas 132 and 130. In an embodiment, cut lines 180 and 182 are placed such that they align up with the edges of a ribbon 160. In an embodiment, cut lines 180 and 182 are placed such that they determine a length of antennas 132 and 130 by adjusting dimension 165. In an embodiment, the ribbon is a polyimide film. In an embodiment, the ribbon is any long and narrow object. For example, the ribbon could be a strand, a string, a fiber, a cloth, a metal fiber, a filament, an oval shaped string, or a film. In an embodiment, film 110 is moved from a first reel to a second reel during processing. In an embodiment, ribbon 160 is advanced from a first reel to a second reel during processing. In an embodiment, the advancement of ribbon 160 is used to determine the spacing of component portion 115 and any similar component portions attached to ribbon 160. In an embodiment, an advancement of the ribbon during the bonding determines a spacing of the one or more component portions on the ribbon. Also, the reel-to-reel processing movement of ribbon 160 can be perpendicular (or any other angle) to the reel-to-reel processing movement of film 170. To this end, the reel-to-reel speed of ribbon 160 relative to the reel-to-reel speed of film 170 determines the pitch placement of component portion 115 onto the ribbon 160. In an embodiment, the method further includes transferring the ribbon from a first reel to a second reel.

Figures 1K, 1L:
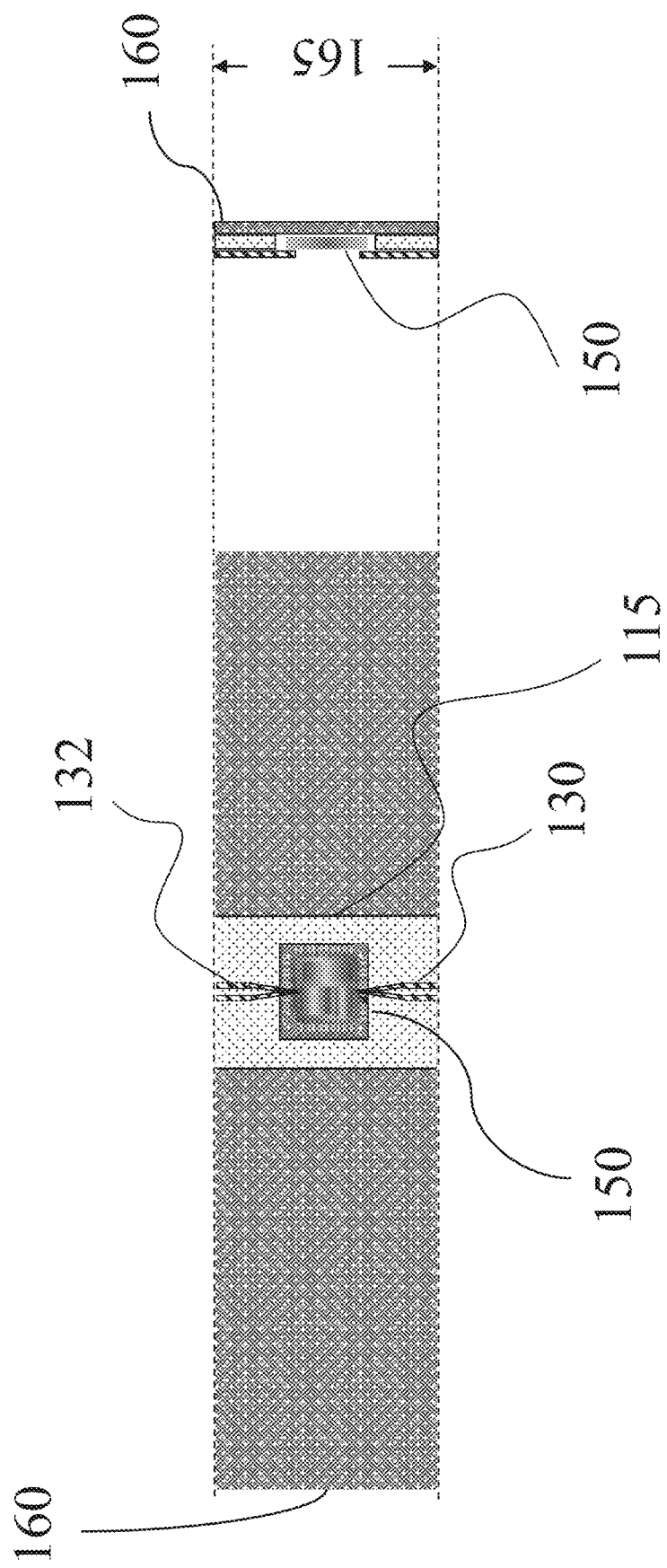
FIG. 1K depicts a diagram in accordance with an exemplary embodiment of the present invention.
FIG. 1L depicts a cross-section diagram in accordance with an exemplary embodiment of the present invention.

Referring to FIGS. 1K and 1L, in an embodiment, component portion 115 is attached to ribbon 160. For example, component portion 115 could be epoxied, molded, or embossed onto ribbon 160. In an embodiment, multiple component portions similar to component portion 115 are attached to ribbon 160. In an embodiment, portions of film 110 that are not component portion 115 are not attached to ribbon 160. In an embodiment, ribbon 160 is a section of a larger ribbon. In an embodiment, ribbon 160 is processed using a reel to reel process used in conjunction with the reel to reel process used for processing film 110. In an embodiment, multiple components (such as component portion 115) are attached to ribbon 160. For example, in an assembly process, multiple components, such as component portion 115, could be transferred to ribbon 160 during processing with either substantially the same spacing that they are produced on film 210 or spaced according to need during processing by controlling the reel-to-reel ribbon 160 speed relative to the reel-to-reel film 110 speed.

In an embodiment, component portions similar to component portion 115 contain multiple electronic devices similar to electronic device 150. For example, a component portion may contain two electrical devices, electronic device 150 attached to antenna 132 and 130 and an electrical device (not shown) not directly attached to antenna 132 and 130. In an embodiment, the antennas can be oriented in any desired direction with respect to the ribbon 160. For example, the antennas 132 and 130 could be perpendicular to ribbon 160 as shown, or there could be one or more antennas at angles other than perpendicular to the ribbon. In an embodiment, there are multiple antennas at multiple angles with multiple lengths. For example, the electronic device 150 could have an antenna off of each side, each antenna having a different length. In an embodiment, the length of one or more antennas is selected based on expected operational wavelengths of the electronic device.

Figure 2A:
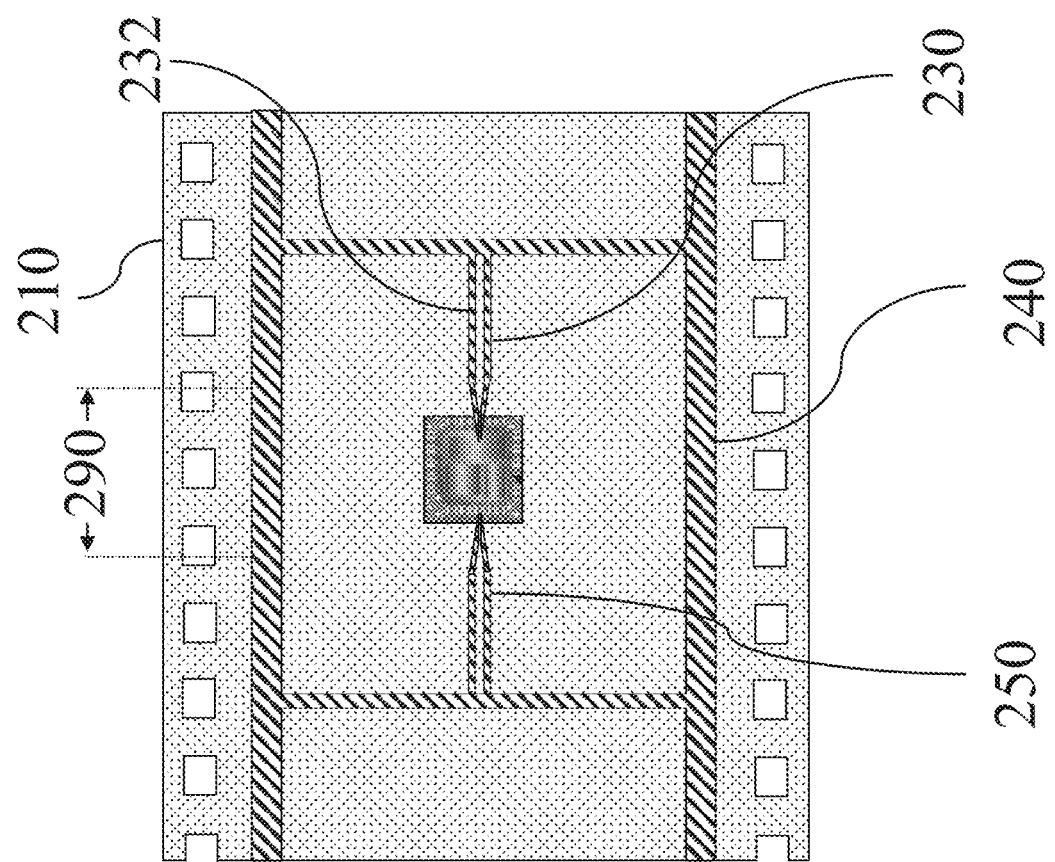
FIG. 2A depicts a diagram in accordance with an exemplary embodiment of the present invention.
Figure 2:
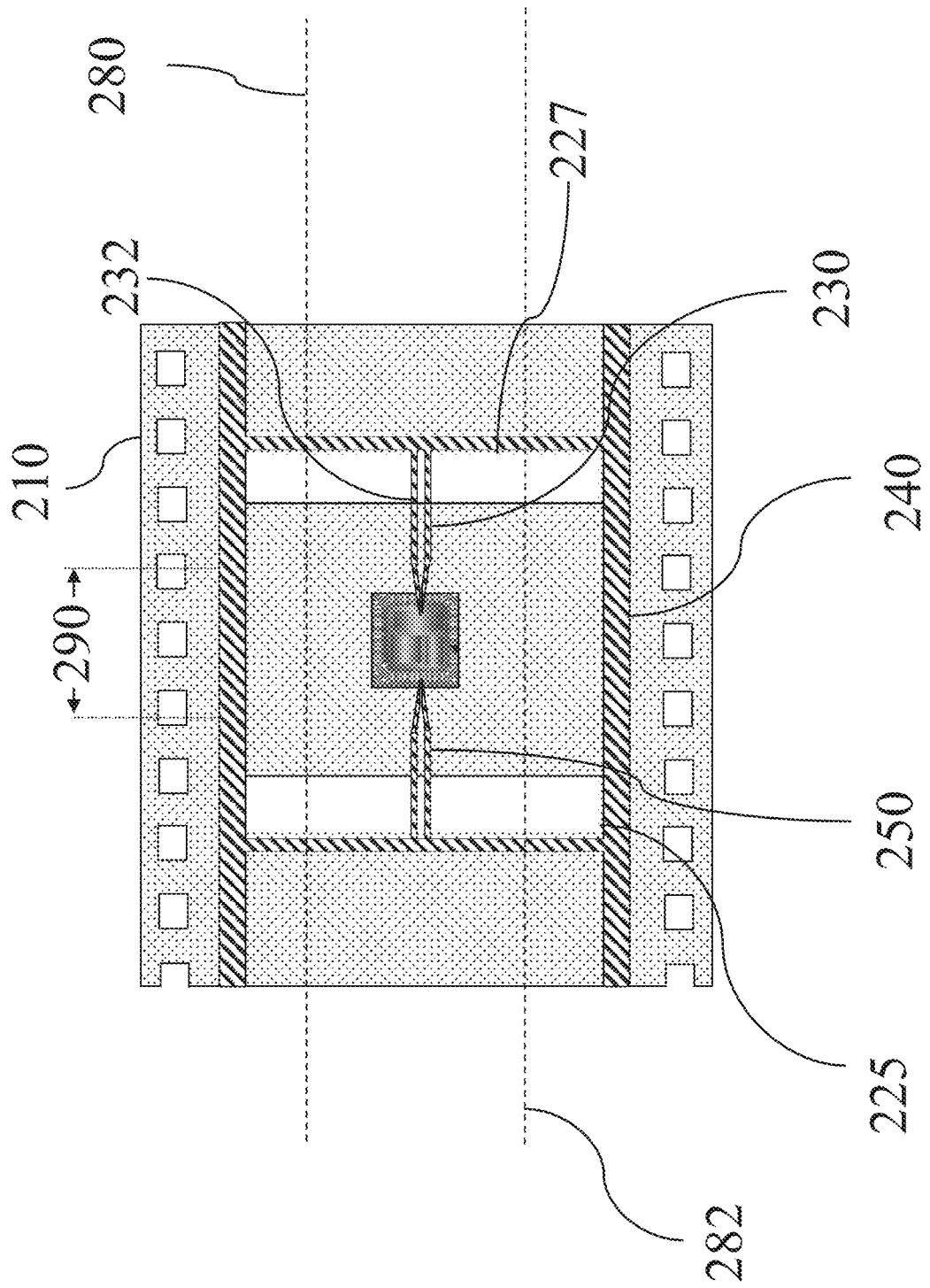
FIG. 2B depicts a diagram in accordance with an exemplary embodiment of the present invention.
FIG. 2C depicts a diagram in accordance with an exemplary embodiment of the present invention.
FIG. 2D depicts a cross section diagram in accordance with an exemplary embodiment of the present invention.

Referring to FIGS. 2A and 2B, in an embodiment, antenna 232, and 230 are to the length of film 210. Thus, the lengths of antennas 232 and 232 are determined by the cutting of holes 232 and 230 and independent of cut lines 280 and 282.

Figures 2C, 2D:
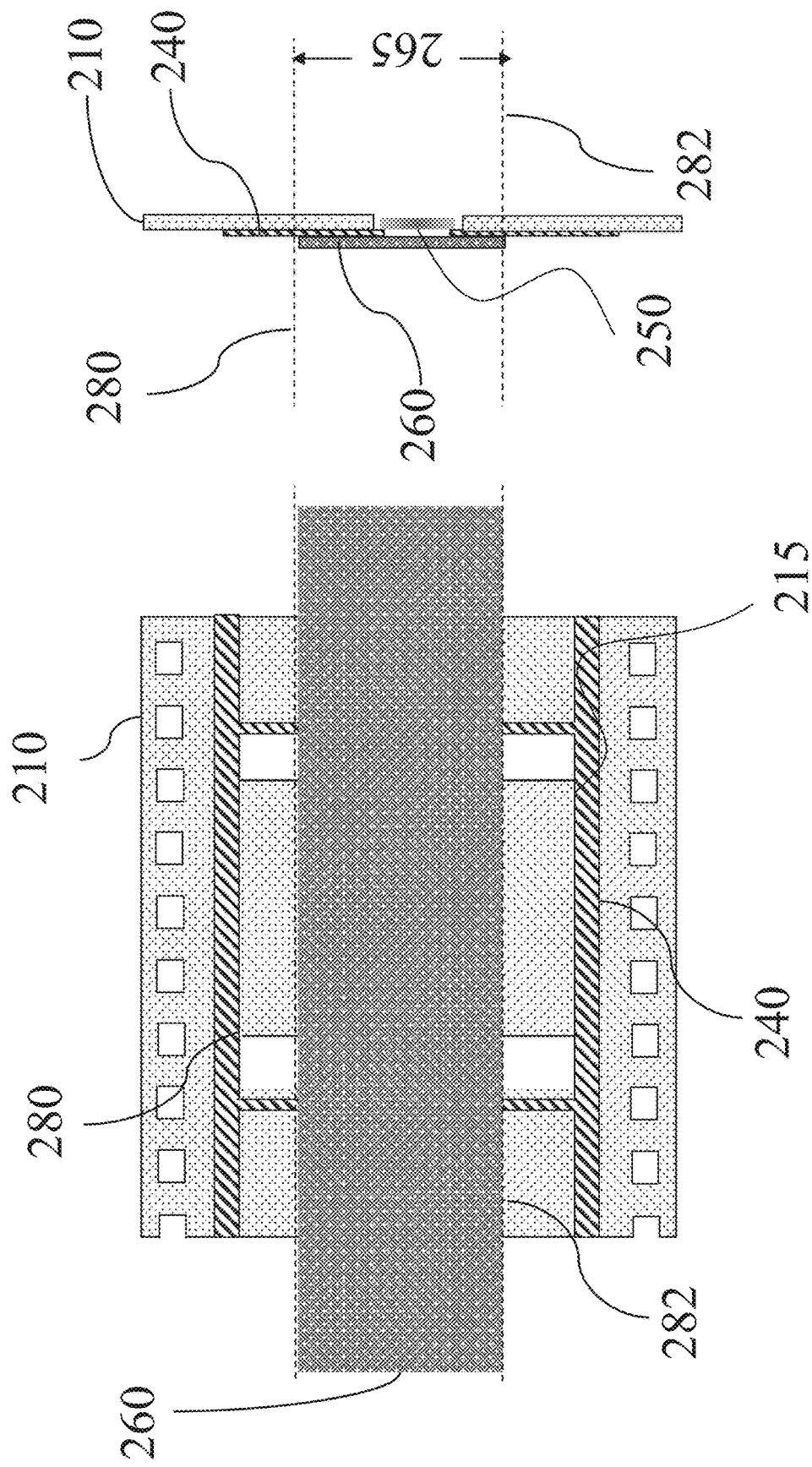

Referring to FIGS. 2C and 2D, in an embodiment, a component portion 215 of film 210 is bonded to a ribbon 260 such that a printed metal 240 side of component portion 215 is towards ribbon 260. In an embodiment, antennas 230 and 232 are sandwiched between component portion 215 and ribbon 260. For example, epoxy could be used to bind component portion 215 to ribbon 260 such that the majority of the antennas are not exposed. Cut lines 280 and 282 can define a dimension 265 of component portion 215. In an embodiment, bonding an electronic device 250 in a hole is done at the same time as bonding component portion 215 to ribbon 260.

Figure 3:
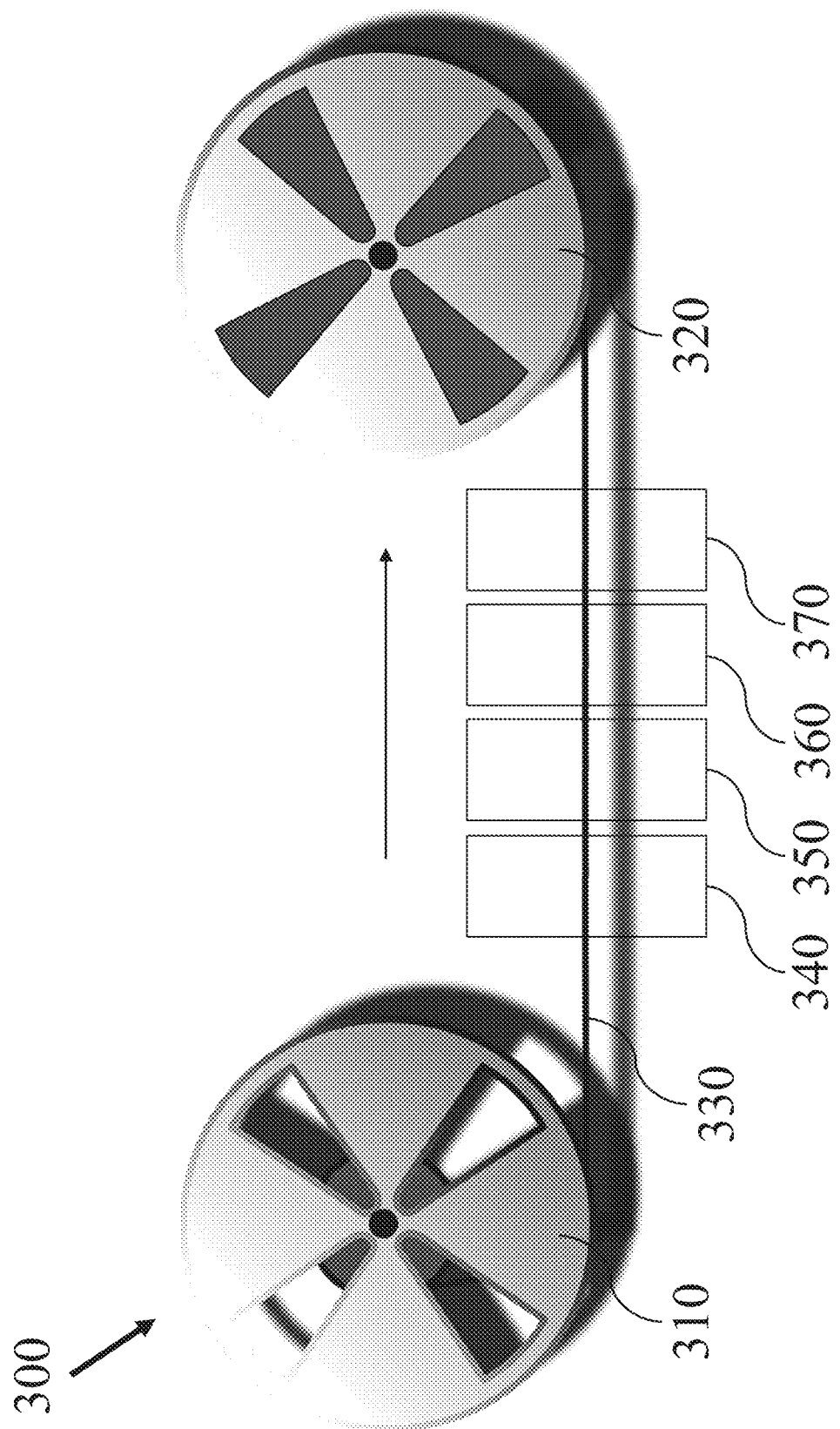
FIG. 3 depicts a diagram in accordance with an exemplary embodiment of the present invention.

Referring to FIG. 3, in an embodiment, station 300 is a reel to reel processing station. In an embodiment, station 300 depicts one portion of a larger processing system, where reel 310 is attached to station 300 for processing before or after the film 330 is processed at a different station. In an embodiment, a reel 310 is placed in station 300 for processing. During processing, the film is moved from reel 310 to reel 320 after going through processing points 340, 350, 360, and 370. In an embodiment, station 300 has more or fewer processing points than depicted. In an embodiment, each processing point 340, 350, 360, or 370 is selected from a group consisting of creating holes, depositing or printing metal, attaching a chip, soldering, cutting film 330, or bonding a component portion of film 330 to a ribbon.

Figure 4A:
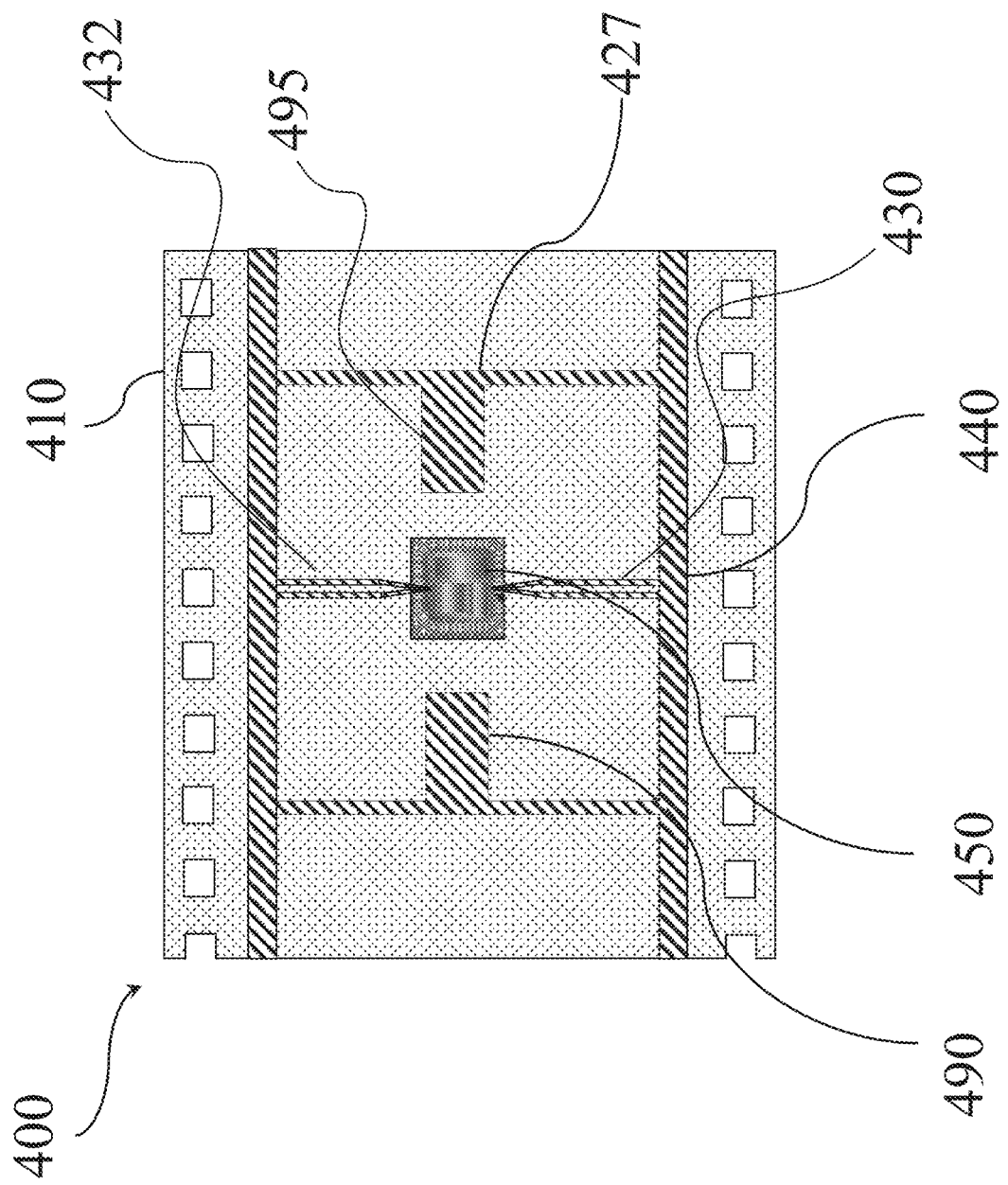
FIGS. 4A and 4B depict a diagram in accordance with an exemplary embodiment of the present invention.
Figure 4B:
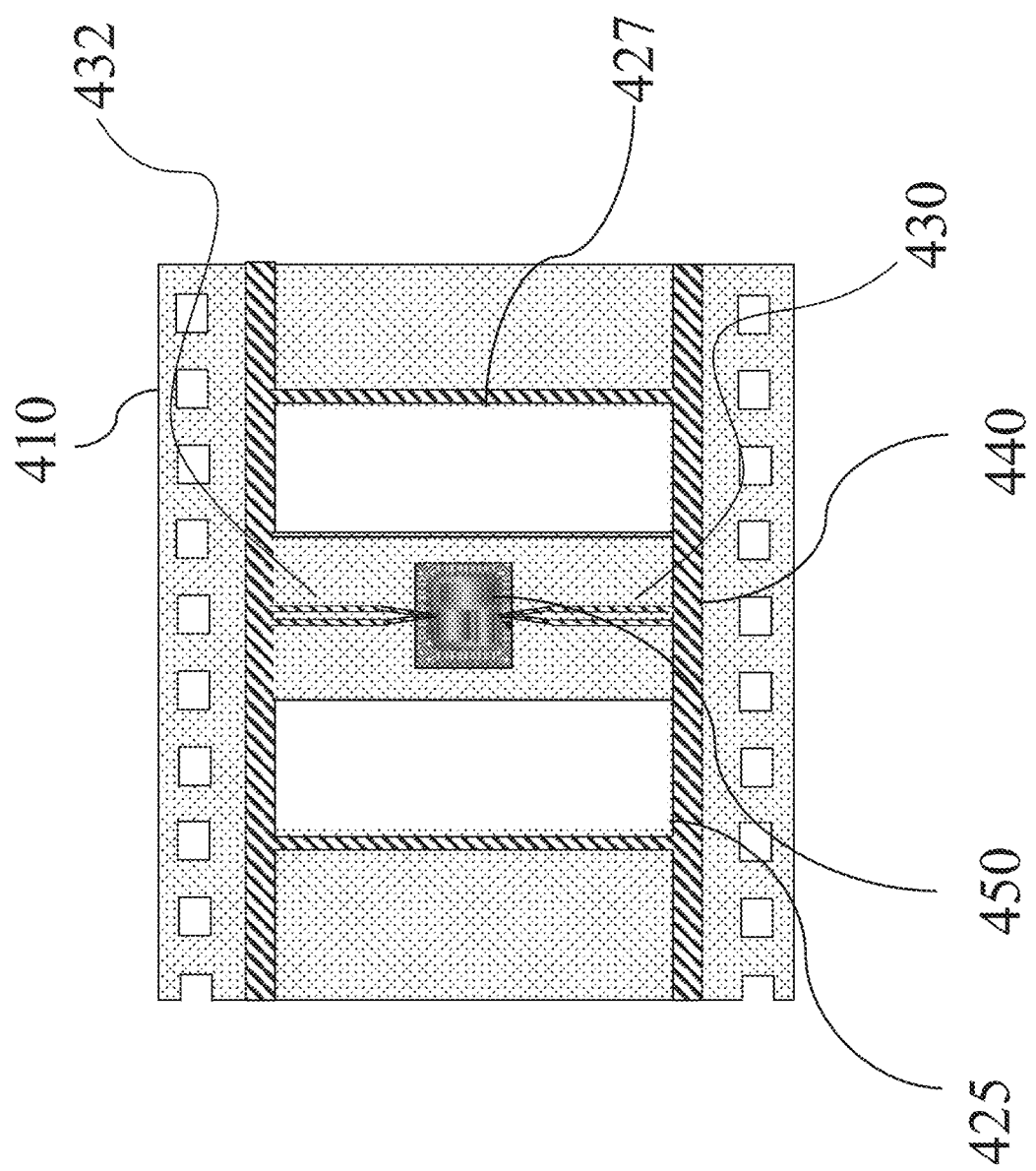

Referring to FIGS. 4A and 4B, in an embodiment, testing pads 490 and 495 are produced during the depositing of conductive pattern 440. In an embodiment, the testing pads 490 and 495 are used to test electronic device 450 through antennas 430 and 432. In and embodiment, more test pads are produced on the tape. For example, the additional test pads could facilitate functionality testing on tape. For example, test pads can also provide electrical access for burn-in or programming of fuses, EPROMS, EEPROMS, FLASH or any other type of write once or write many times non-volatile memory. In an embodiment, a hole for electronic device 450 is created in a first step, and holes 425 and 427 are created in a second step. In an embodiment, the creation of holes 425 and 427 removes testing pads 490 and 495 from film 410.

Figure 5:
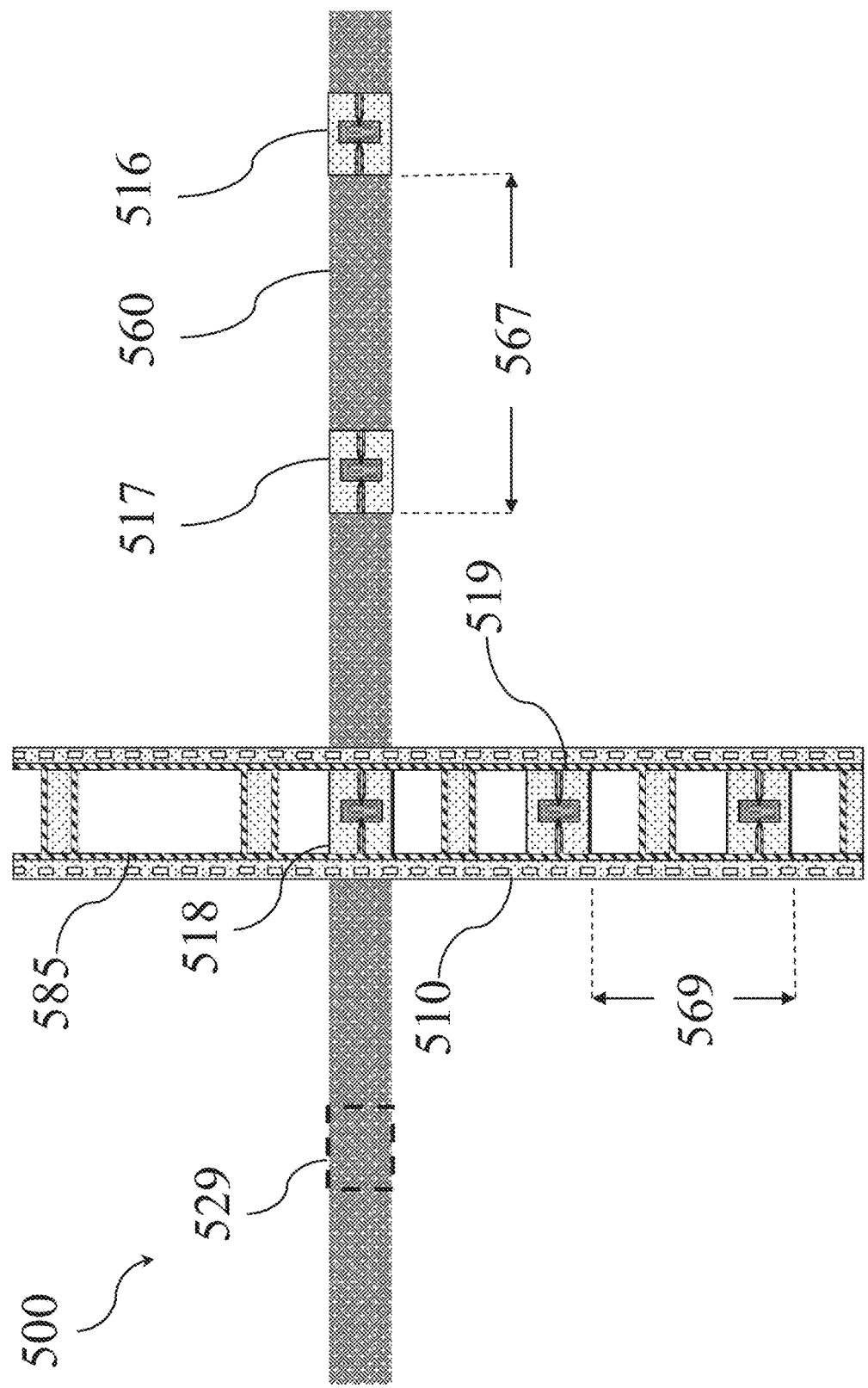
FIG. 5 depicts a diagram in accordance with an exemplary embodiment of the present invention.

Referring to FIG. 5, in an embodiment, an increment 567 of one or more component portions 516, 517, and 518 on a ribbon 560 is dictated by the desired application. For example, if currency is a desired application, increment 567 of one or more component portions 516, 517, and 518 on a ribbon could be the width of the currency such that one component portion 516, 517, or 518 is on every piece of currency after ribbon 560 is incorporated into the currency. Similarly, increment 567 could be half the width of the currency if two component portions 516, 517, or 518 are to be included on every piece of currency. In an embodiment, an increment 569 of component portions (such as component portions 516, 517, and 518) on tape 510 is dictated by processing parameters (such as the spacing of components required for the final product) of tape 510. In an embodiment, tape 510 and ribbon 560 are advanced in increments. For example, tape 510 is advanced forward by increment 569, ribbon 560 is advanced by increment 567, a component portion (such as component portion 517) is cut from tape 510, leaving hole 585 on tape 510, and bonded to ribbon 560. Tape 510 is advanced by increment 569, ribbon 560 is advanced by increment 567 again and a new component portion (such as component portion 518) is cut from tape 510, leaving a hole (where component portion 518 is shown) on tape 510, and bonded to ribbon 560. In an embodiment, an area 529 is where a component portion 519 will be bonded after component portion 519 is removed from tape 510. In an embodiment, an increment is a spacing.

Figure 6A:
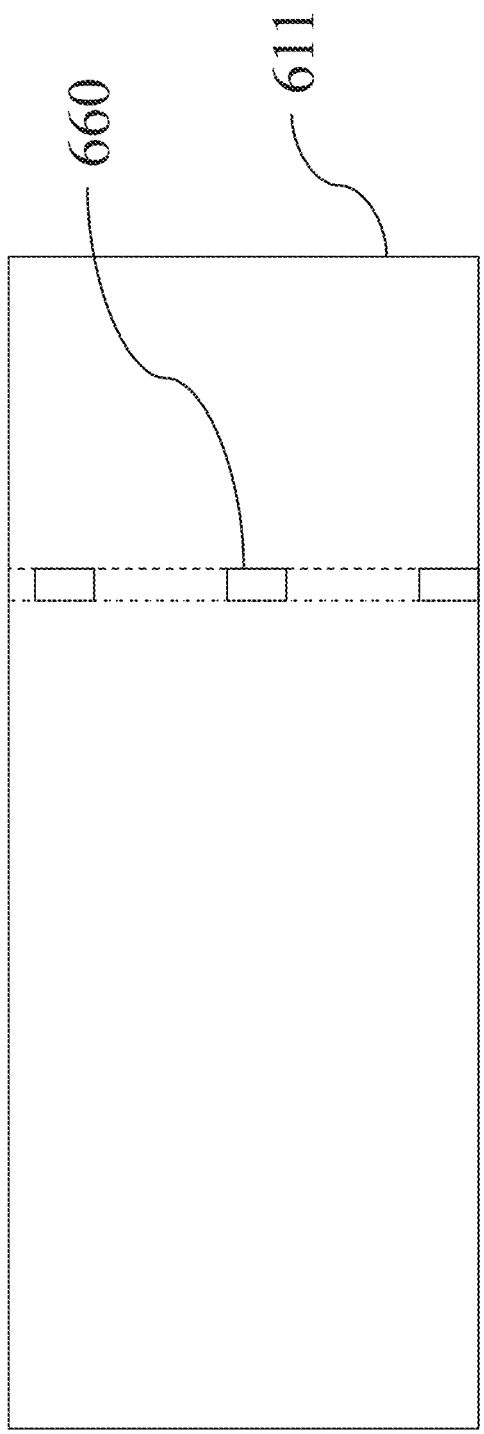
FIG. 6A depicts a diagram in accordance with an exemplary embodiment of the present invention.
Figure 6B:
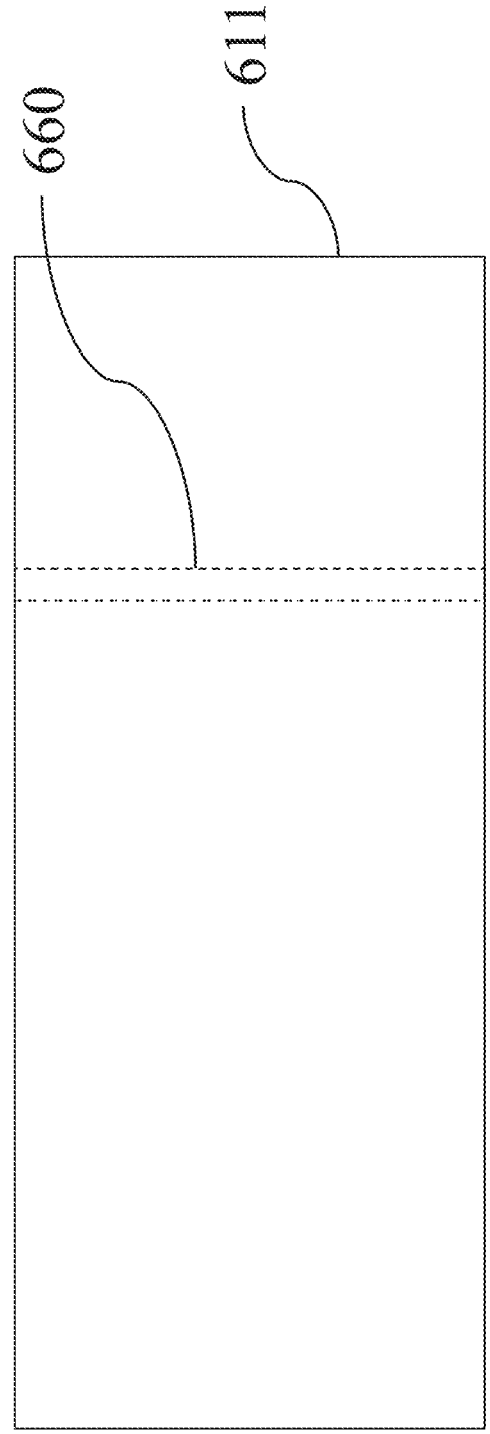
FIG. 6B depicts a diagram in accordance with an exemplary embodiment of the present invention.

Referring to FIGS. 6A and 6B, in an embodiment, a ribbon 660 with one or more component portions is incorporated into a piece of paper 611. In an embodiment, ribbon 660 is woven into the piece of paper 611. For example, solid rectangles of ribbon 660 show the portions of ribbon 660 that are visible above piece of paper 611. Dashed portions of ribbon 660 show the area of 660 that is not visible on the front side of the piece of paper. In an embodiment, a dashed line of ribbon 660 in FIG. 6B shows that piece of paper is not visible from a surface of piece of paper 611. In an embodiment, ribbon 660 may be partially visible from both sides of piece of paper 611. In an embodiment, ribbon 660 may be partially visible from one side of piece of paper 611 and not visible from the other side of piece of paper 611. In an embodiment, ribbon 660 may be substantially obscured from sight on both sides of piece of paper 611. For example, the ribbon could be integrated into a bill similar to how a security strip is integrated into the United States $100 bill. In an embodiment, not visible does not necessarily mean that scrutinizing the bill would not reveal ribbon the presence of 660, but instead indicates that ribbon 660 generally blends into paper 611.

Figure 7:
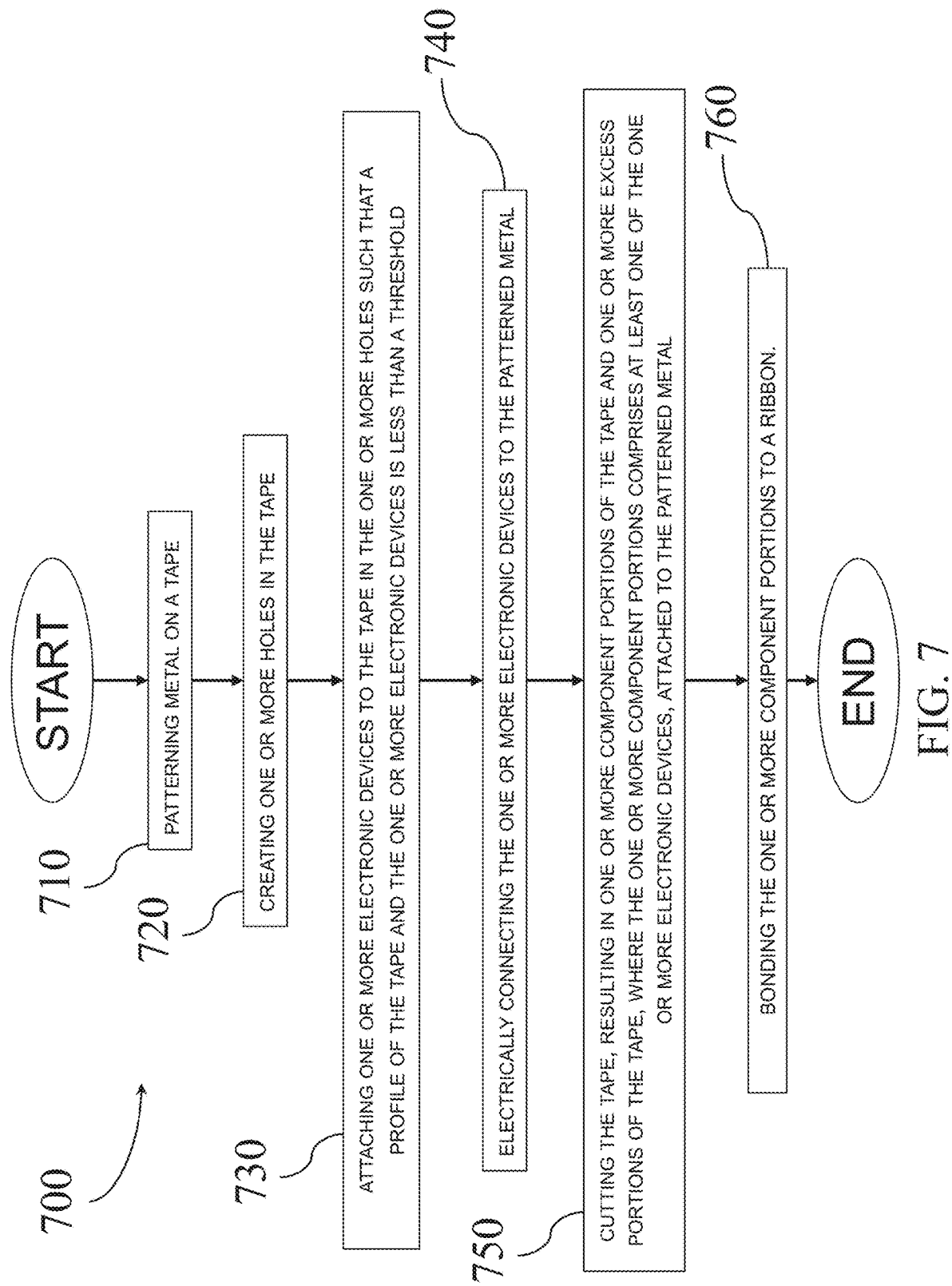
FIG. 7 depicts a flowchart in accordance with an embodiment of the present invention.

Referring to FIG. 7, in an embodiment, a method 700 of the present invention is configured to perform an operation 710 of patterning metal on a tape, an operation 720 of creating one or more holes in the tape, an operation 730 of attaching one or more electronic devices to the tape in the one or more holes such that a profile of the tape and the one or more electronic devices is less than a threshold, an operation 740 of electrically connecting the one or more electronic devices to the patterned metal, an operation 750 of cutting the tape, resulting in one or more component portions of the tape and one or more excess portions of the tape, where the one or more component portions have at least one electronic device, among the one or more electronic devices, attached to the patterned metal, and an operation 760 of bonding the one or more component portion to a ribbon. In an embodiment, the threshold is a desired thickness of the component portion. For example, where the profile of the tape and the one or more electronic devices is less than a threshold, the threshold is a desired thickness of the component portion as determined by the final product the component portion/ribbon will be attached to.

Figure 8:
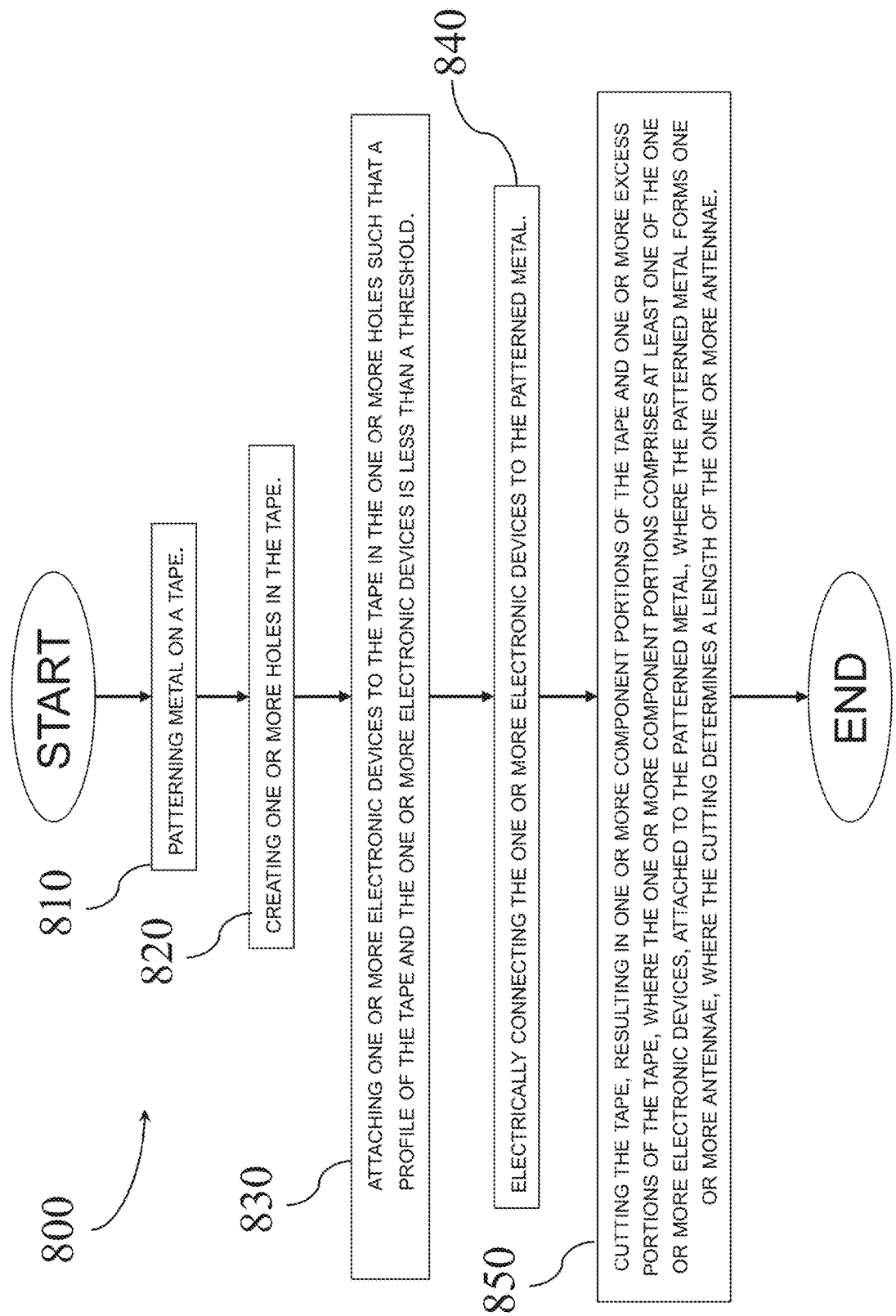
FIG. 8 depicts a flowchart in accordance with an exemplary embodiment of the present invention.

Referring to FIG. 8, in an embodiment, a method 800 of the present invention is configured to perform an operation 810 of patterning metal on a tape, an operation 820 of creating one or more holes in the tape, an operation 830 of attaching one or more electronic devices to the tape in the one or more holes such that a profile of the tape and the one or more electronic devices is less than a threshold, an operation 840 of electrically connecting the one or more electronic devices to the patterned metal, and an operation 850 of cutting the tape, resulting in one or more component portions of the tape and one or more excess portions of the tape, where the one or more component portions have at least one electronic device, where the patterned metal forms one or more antennas, where the cutting determines a length of the one or more antennas, among the one or more electronic devices, attached to the patterned metal. In an embodiment, the patterned metal forms an antenna.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method, comprising:
   patterning metal on a tape;
   creating one or more holes in the tape;
   attaching one or more electronic devices to the tape in the one or more holes such that a profile of the tape and the one or more electronic devices is less than a threshold;
   electrically connecting the one or more electronic devices to the patterned metal; and
   cutting the tape, resulting in one or more component portions of the tape and one or more excess portions of the tape,
   wherein the one or more component portions comprises at least one of the one or more electronic devices, attached to the patterned metal.

2. The method of claim 1, wherein the tape comprises holes along at least one edge of the tape for advancing the tape.

3. The method of claim 1, further comprising transferring the tape from a first reel to a second reel.

4. The method of claim 1, wherein the tape has feeder holes.

5. The method of claim 1, further comprising:
determining a desired spacing for the one or more component portions; and
bonding the one or more component portions to a ribbon withe the determined spacing.

6. The method of claim 1, wherein a location of the cutting determines a length of the patterned metal on both the one or more component portions and the one or more excess portions of the tape.

7. The method of claim 1, wherein the patterned metal forms an antenna.

8. The method of claim 1 further, comprising bonding the one or more devices to the tape.

9. The method of claim 1, wherein the one or more electronic devices comprises a two-chip stack.

10. The method of claim 9, wherein the two-chip stack comprises two chips connected using flip chip bonding.

11. A structure, comprising:
a tape;
a patterned metal on the tape;
one or more electronic devices attached to the tape such that a profile of the tape and the one or more devices is less than a threshold; and
one or more electrical connections formed between the patterned metal and the one or more electronic devices.

12. A method, comprising:
patterning metal on a tape;
creating one or more holes in the tape;
attaching one or more electronic devices to the tape in the one or more holes such that a profile of the tape and the one or more electronic devices is less than a threshold;
electrically connecting the one or more electronic devices to the patterned metal; and
cutting the tape, resulting in one or more component portions of the tape and one or more excess portions of the tape,
wherein the one or more component portions comprises at least one of the one or more electronic devices attached to the patterned metal.

13. The method of claim 12, further comprising bonding the one or more component portions to a ribbon.

14. The method of claim 12, wherein the tape comprises holes along at least one edge of the tape for advancing the tape.

15. The method of claim 12, further comprising transferring the tape from a first reel to a second reel.

16. The method of claim 12, further comprising transferring the ribbon from a first reel to a second reel.

17. The method of claim 12, wherein the bonding comprises advancing the ribbon thereby determining a spacing of the one or more component portions on the ribbon.

18. The method of claim 12 further, comprising bonding the one or more devices to the tape.

19. The method of claim 12, wherein the one or more electronic devices comprises a two-chip stack.

20. The method of claim 12, wherein the two-chip stack comprises two chips connected using flip chip bonding.

* * * * *